(12) United States Patent
Koyama et al.

(10) Patent No.: US 7,459,355 B2
(45) Date of Patent: *Dec. 2, 2008

(54) DRIVE CIRCUIT OF ACTIVE MATRIX DEVICE AND MANUFACTURING METHOD THEREOF

(75) Inventors: Jun Koyama, Sagamihara (JP); Yuji Kawasaki, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 207 days.

This patent is subject to a terminal disclaimer.

(21) Appl. No.: 11/398,601

(22) Filed: Apr. 6, 2006

(65) Prior Publication Data

US 2006/0189105 A1    Aug. 24, 2006

Related U.S. Application Data

(60) Division of application No. 09/902,622, filed on Jul. 12, 2001, now Pat. No. 7,027,022, which is a continuation of application No. 08/974,163, filed on Nov. 19, 1997, now abandoned, which is a division of application No. 08/421,440, filed on Apr. 13, 1995, now abandoned.

(30) Foreign Application Priority Data

Apr. 22, 1994   (JP)   .................... 6-107573

(51) Int. Cl.
   *H01L 21/00*   (2006.01)
(52) U.S. Cl. .................. 438/166; 438/151; 438/155; 438/486

(58) Field of Classification Search ............. 438/166, 438/151, 155
See application file for complete search history.

(56) References Cited

U.S. PATENT DOCUMENTS 4,330,363 A    5/1982   Biegesen et al.

(Continued)

FOREIGN PATENT DOCUMENTS

EP    0091806    10/1983

(Continued)

OTHER PUBLICATIONS

M. Bonnel et al., "Polycrystalline Silicon Thin-Film Transistors with Two- Step Annealing Process," IEEE Electron Device Letters, vol. 14, No. 12, Dec. 1993, pp. 551-553.

(Continued)

*Primary Examiner*—Walter L. Lindsay, Jr.
*Assistant Examiner*—Kenisha V Ford
(74) *Attorney, Agent, or Firm*—Eric J. Robinson; Robinson Intellectual Property Law Office, P.C.

(57) ABSTRACT

A data holding control signal for each data line is supplied to a plurality of source followers that are connected together in parallel. The parallel-connected source followers are a combination of at least one first follower that is illuminated with laser light only once and at least one second follower that is illuminated twice. A width of the laser light illumination for crystallization is equal to a pitch of the source followers multiplied by an integer that is not less than 3.

14 Claims, 11 Drawing Sheets

U.S. PATENT DOCUMENTS

| | | |
|---|---|---|
| 4,466,179 A | 8/1984 | Kasten |
| 4,822,752 A | 4/1989 | Sugahara et al. |
| 4,931,787 A | 6/1990 | Shannon |
| 5,145,808 A | 9/1992 | Sameshima et al. |
| 5,166,671 A | 11/1992 | Maekawa |
| 5,194,853 A | 3/1993 | Asada |
| 5,247,375 A | 9/1993 | Mochizuki et al. |
| 5,264,383 A | 11/1993 | Young |
| 5,335,023 A | 8/1994 | Edwards |
| 5,357,290 A | 10/1994 | Horibe |
| 5,365,875 A | 11/1994 | Asai et al. |
| 5,371,381 A | 12/1994 | Sugahara et al. |
| 5,372,836 A | 12/1994 | Imahashi et al. |
| 5,376,926 A | 12/1994 | Sano |
| 5,403,762 A | 4/1995 | Takemura |
| 5,413,958 A | 5/1995 | Imahashi et al. |
| 5,432,122 A | 7/1995 | Chae |
| 5,477,073 A | 12/1995 | Wakai et al. |
| 5,529,630 A | 6/1996 | Imahashi et al. |
| 5,589,406 A | 12/1996 | Kato et al. |
| 5,589,847 A | 12/1996 | Lewis |
| 5,680,149 A | 10/1997 | Koyama et al. |
| 5,744,824 A | 4/1998 | Kousai et al. |
| 5,999,483 A | 12/1999 | Itou |
| 6,057,183 A * | 5/2000 | Koyama et al. ............ 438/166 |
| 6,177,916 B1 | 1/2001 | Aoki et al. |
| 6,335,633 B1 | 1/2002 | Kirsch |
| 6,496,171 B2 * | 12/2002 | Yamazaki .................... 345/92 |
| 7,015,057 B2 | 3/2006 | Koyama et al. |

FOREIGN PATENT DOCUMENTS

| | | |
|---|---|---|
| JP | 58-127318 | 7/1983 |
| JP | 58-162032 | 9/1983 |
| JP | 59-161014 | 9/1984 |
| JP | 59-229834 | 12/1984 |
| JP | 61-116334 | 6/1986 |
| JP | 62-019855 | 2/1987 |
| JP | 62-206819 | 9/1987 |
| JP | 01-237697 | 9/1989 |
| JP | 02-042717 | 2/1990 |
| JP | 03-10292 | 1/1991 |
| JP | 03-166589 | 7/1991 |
| JP | 04-070897 | 3/1992 |
| JP | 04-282869 | 10/1992 |
| JP | 05-107558 | 4/1993 |
| JP | 5-175235 | 7/1993 |
| JP | 5-203977 | 8/1993 |
| JP | 06-252048 | 9/1994 |

OTHER PUBLICATIONS

I. Fujieda et al., "Self-Referenced Poly-Si TFT Amplifier Readout for a Linear Image Sensor," IEDM '93, pp. 587-590.

M. Fuse et al., "Performance of Poly-Si Thin Film Transistors Fabricated by Excimer Laser Annealing of $SiH_4$- and $SiH_2H_6$- Source Low Pressure Vapor Deposited a-Si Films With or Without Solid-Phase Crystallization," pp. 565-570.

K. Yoneda et al., "A smart arrangement of TFTs in low-temperature poly-silicon circuitry for achieving higher effective yield in production". LCD Divisions, Semiconductor Business HQ, Sanyo Electric Co., (1997) pp. L1-L4.

Webster's II New Riverside University Dictionary, Houghton-Mifflin Company, 1994.

* cited by examiner

DRIVE CIRCUIT OF ACTIVE MATRIX DEVICE AND MANUFACTURING METHOD THEREOF

BACKGROUND OF THE INVENTION

The present invention relates to a drive circuit of an active matrix type display device which is composed of thin-film transistors. In particular, the invention relates to a drive circuit of an active matrix type display device in which source followers are used as analog buffers and variations of their characteristics are suppressed.

The active matrix type display device is a display device in which pixels are arranged at intersections of a matrix with every pixel associated with a switching element, and image information is controlled by turning on/off of the switching elements. This type of display device uses, as a display medium, a liquid crystal, plasma, or some other material or state whose optical characteristic (reflectance, refractive index, transmittance, luminous intensity, or the like) can be varied electrically. In the present invention, specifically a field-effect transistor (three-terminal element) having the gate, source and drain is used as the switching element.

In the following description of the invention, a row of a matrix means a structure in which a signal line (gate line) that is disposed parallel with the row concerned is connected to the gate electrodes of transistors of the row concerned. A column means a structure in which a signal line (source line) that is disposed parallel with the column concerned is connected to the source (or drain) electrodes of transistors of the column concerned. A circuit for driving the gate lines is called a gate drive circuit, and a circuit for driving the source lines is called a source drive circuit.

In the gate drive circuit, stages of a shift register corresponding to the number of gate lines in the vertical direction are arranged linearly and interconnected in series to generate signals of vertical scanning timings of the active matrix type display device. In this manner, the thin-film transistors of the active matrix type display device are switched by means of the gate drive circuit.

In the source drive circuit, stages of a shift register corresponding to the number of source lines in the horizontal direction are arranged linearly and interconnected in series to generate horizontal image data of display image data of the active matrix display device. Analog switches are turned on/off by latch pulses that are synchronized with horizontal scanning signals. In this manner, currents are supplied to the thin-film transistors of the active matrix type display device by means of the source drive circuit, to control orientations of liquid crystal cells.

Figure 9:
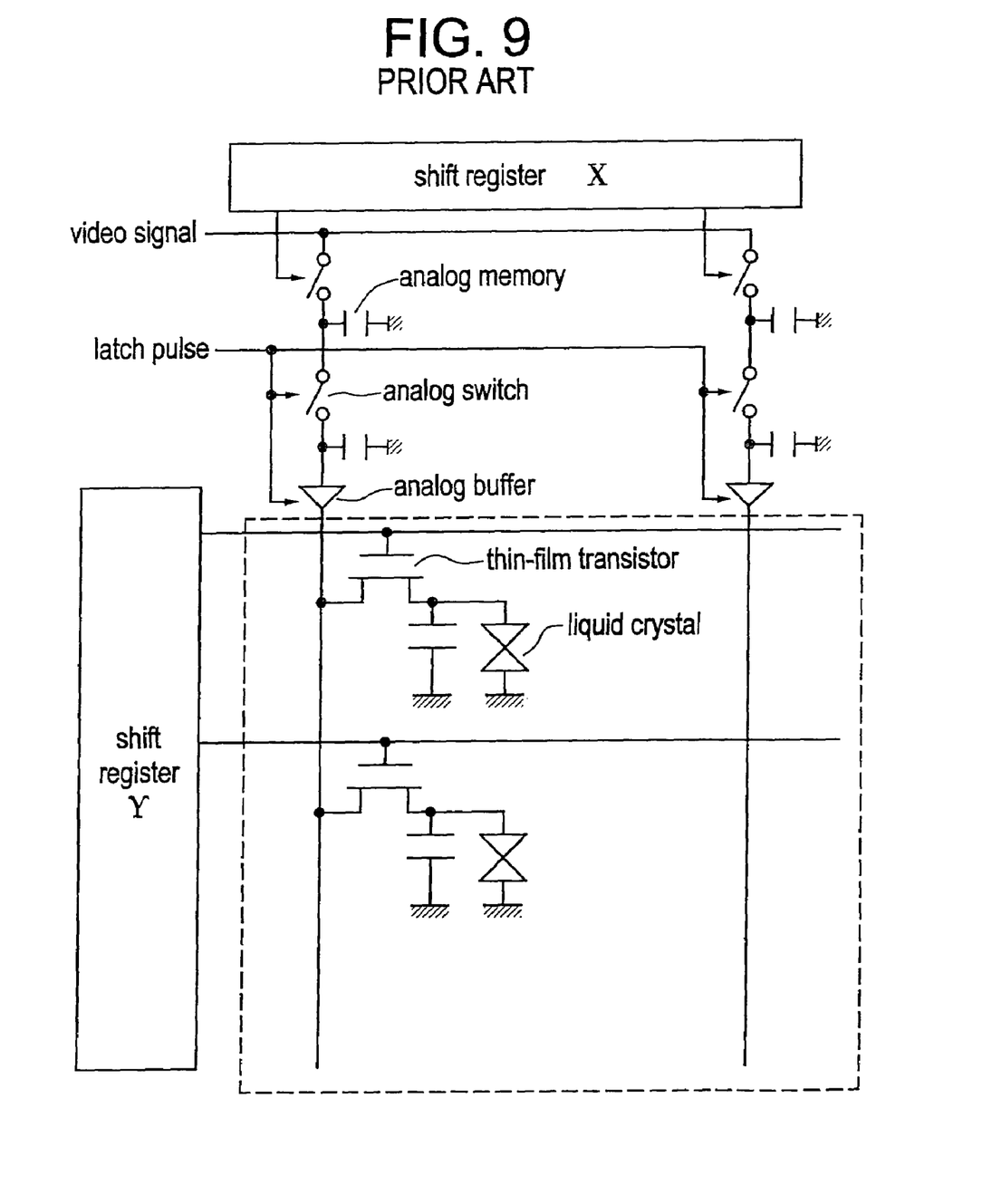
FIG. 9 schematically shows the conventional active matrix type display device.

FIG. 9 schematically shows a conventional active matrix type display device. There are two kinds of polycrystalline silicon thin-film transistor manufacturing processes: a high-temperature process and a low-temperature process. In the high-temperature process, polycrystalline silicon is deposited on an insulating film that is formed on a quartz substrate, and a thermally oxidized $SiO_2$ is formed as a gate insulating film. Thereafter, gate electrodes are formed, N-type or P-type ions are implanted, and source and drain electrodes are formed. Thus, polycrystalline silicon thin-film transistors are manufactured.

In the low-temperature process, silicon is crystallized by two kinds of methods: solid-phase growth and laser annealing. In the solid-phase growth, a polycrystalline silicon film is obtained by subjecting an amorphous silicon film on an insulating film that is formed on a glass substrate to a heat treatment of 600° C. and 20 hours, for example. In the laser annealing, a polycrystalline silicon film is obtained by applying laser light to amorphous silicon on a glass substrate surface to thereby heat-treat only the film surface portion at a high temperature.

In general, crystalline films are obtained by using one or both of the above two methods.

An $SiO_2$ film is then formed as a gate insulating film by plasma CVD. Thereafter, gate electrodes are formed, N-type or P-type ions are implanted, and source and drain electrodes are formed. Thus, polycrystalline silicon thin-film transistors are manufactured.

The source drive circuit is a circuit for supplying image data to an active matrix panel of the active matrix type display device by scanning it vertically, and is composed of a shift register, analog switches that are thin-film transistors, analog memories that are capacitors, and analog buffers formed of thin-film transistors.

The analog buffer is needed because the analog memory cannot directly drive the thin-film transistors of the active matrix type display device due to a large load capacitance of the source line.

Figure 6A:
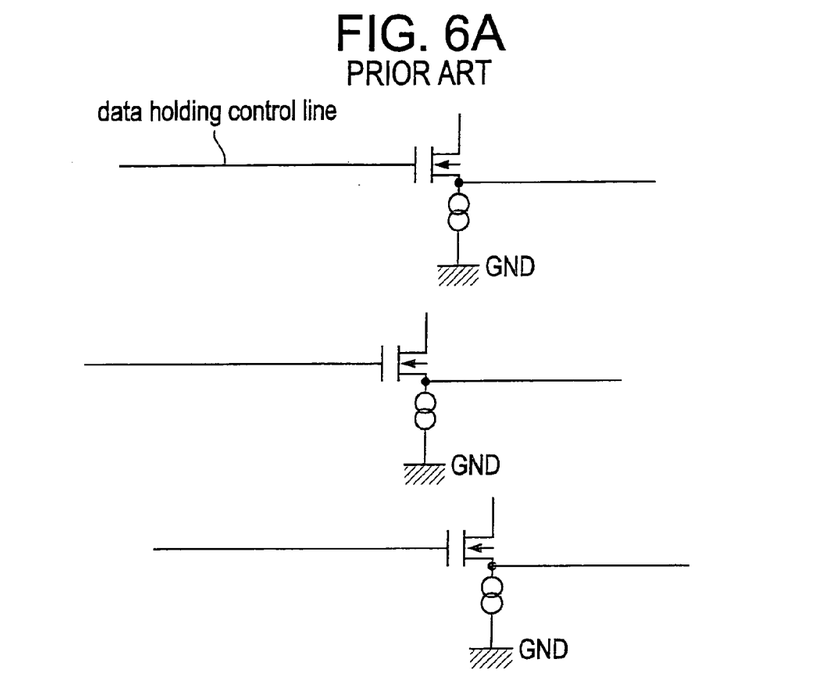
FIGS. 6A and 6B are circuit diagrams showing examples of analog buffers used in a conventional active matrix type display device.
Figure 6B:
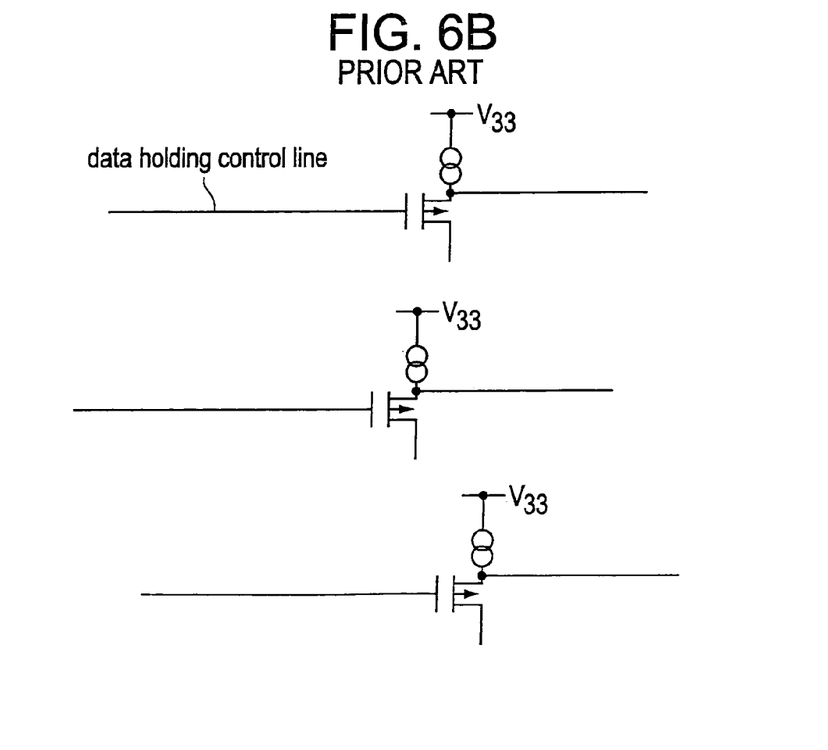

The thin-film transistor of the analog buffer has a source follower configuration. As shown in FIGS. 6A and 6B, a single thin-film transistor is provided for each data holding control signal line, and the thin-film transistors are so manufactured as to be arranged at regular intervals.

FIG. 6A shows an example of using N-channel thin-film transistors. Alternatively, P-channel thin-film transistors (see FIG. 6b) or both types of transistors may be used.

The analog buffers that constitute the source drive circuit of the conventional active matrix type display device have the following problem.

Figure 7A:
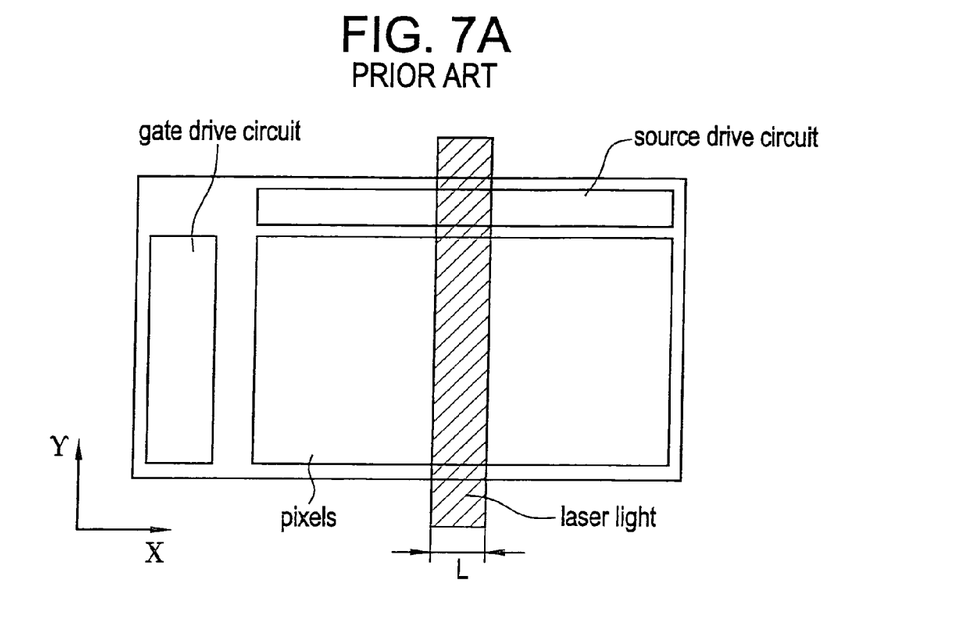
FIGS. 7A and 7B schematically illustrate laser light illumination in a conventional analog buffer manufacturing step.

Each analog buffer has the single thin-film transistor that has a source follower configuration. When laser annealing is employed as a means for crystallization as described above in the thin-film transistor manufacturing process, a silicon film on a glass substrate is irradiated with band-like laser light of a width L while being scanned with it in the X-axis direction, i.e., horizontally (see FIG. 7A) to crystallize silicon, because there exists no such large-diameter laser device as can irradiate a large-size substrate at one time.

Figure 7B:
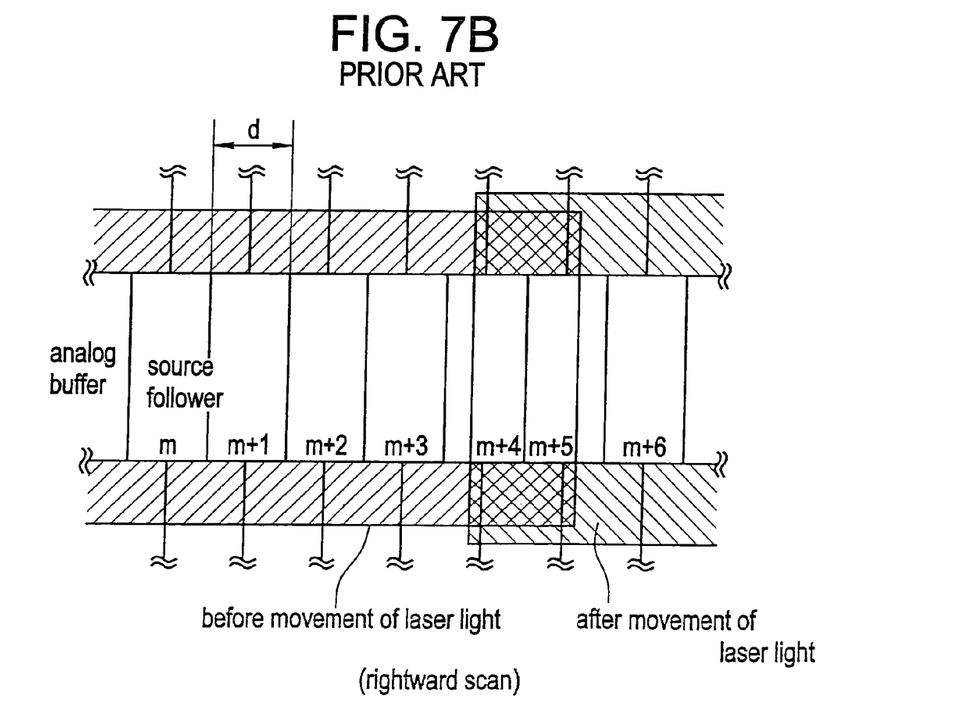

When the illumination is effected while the laser light is moved in the X-direction at a constant length at a time, there occurs an overlap of illumination. Since the width L of the band-like laser light does not necessarily coincide with a pitch d (see FIG. 7B) of the source follower, the illumination laser light quantity varies depending on the position on the silicon film in the laser crystallization step.

Figure 8:
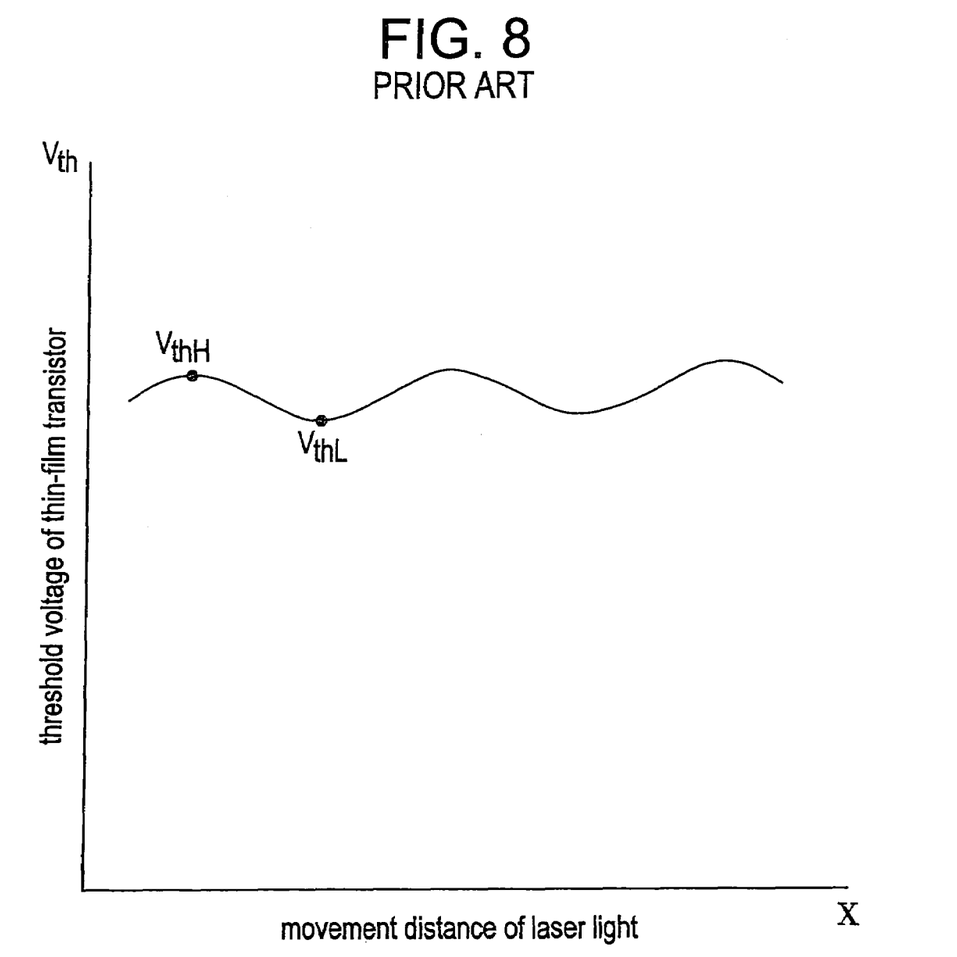
FIG. 8 is a graph showing a relationship between the threshold voltage $V_{th}$ of thin-film transistors used in the conventional analog buffers and the laser light illumination position X in a thin-film transistor manufacturing process.

Therefore, a positional variation, i.e., variations in characteristics occur in thin-film transistors that are produced from the above silicon film, and the threshold voltage $V_{th}$ varies from one thin-film transistor to another in the range of $V_{thL}$ to $V_{thH}$ depending on the position X on the X-axis (see FIG. 8). The threshold voltage $V_{th}$ has a small value at a position where laser beams overlap with each other, and has a large value where they do not. As a result, there occurs a variation in magnitude of output voltages of the source followers, which directly results in a variation of application voltages to the liquid crystal device.

Figure 11:
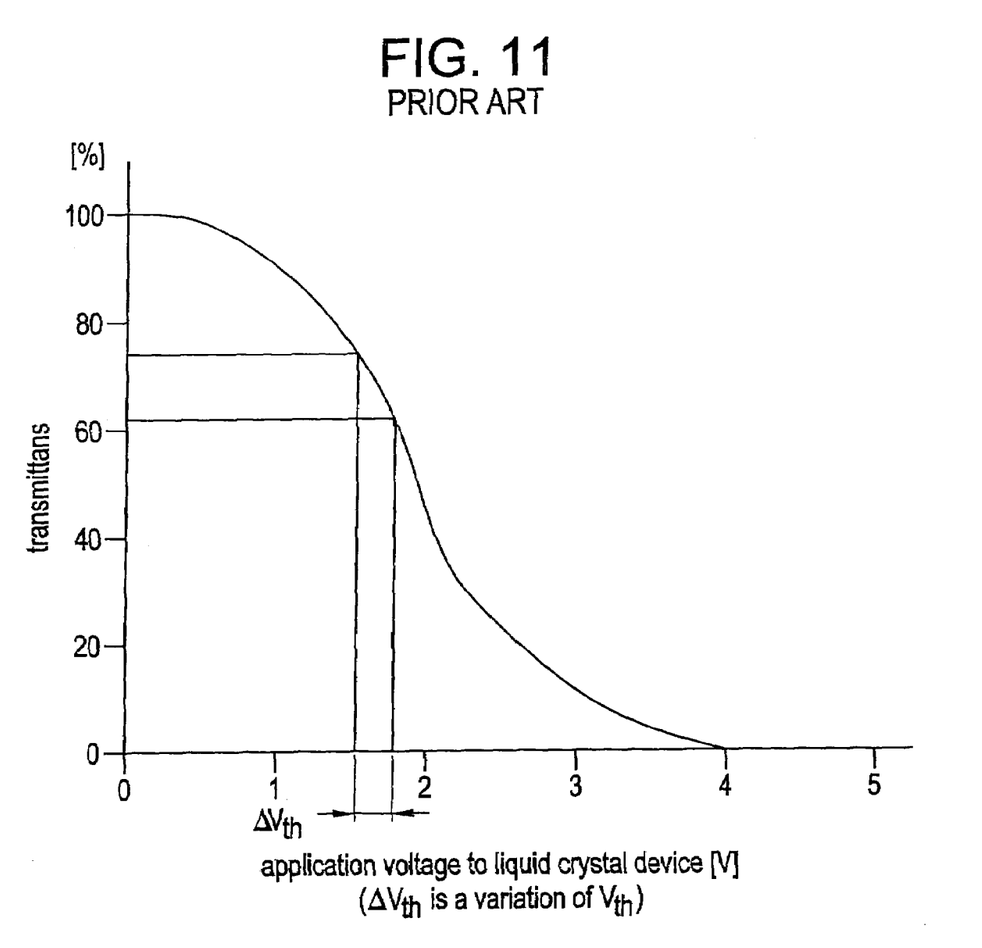
FIG. 11 is a graph showing an application voltage vs. transmittance characteristic of a normally-white liquid crystal device.

FIG. 11 shows an application voltage vs. transmittance characteristic of a normally-white liquid crystal device. It is understood that a variation $\Delta V_{th}$ of the threshold voltage $V_{th}$ causes a corresponding variation of the transmittance, which is reflected in a displayed image.

As described above, the output voltages of the source drive circuit undesirably vary depending on positions thereof, resulting in display unevenness of pixels of the active matrix type display device.

SUMMARY OF THE INVENTION

An object of the present invention is to reduce display unevenness of pixels in an active matrix type display device.

In contrast to the conventional device in which a single analog buffer is provided for a data holding control signal for each data line, the present invention is characterized in that a data holding control signal is connected with a plurality of source followers that are connected together in parallel. Further, in accordance with a preferred embodiment of the present invention, the parallel-connected source followers are a combination of at least one source follower that is irradiated with laser light and at least one source follower that is irradiated twice for crystallization.

A width L of the laser light illumination for crystallization is preferably larger than a pitch d of the source followers, and is equal to the pitch d multiplied by an integer n that is not less than 3. Further, the invention is characterized in that 2 to n−1 source followers are connected together in parallel. A variation of the threshold voltage of thin-film transistors can be suppressed by combining source followers that are illuminated at different numbers of times.

Although the pitch of the source followers and the width of laser light illumination have been mentioned above, the term "pitch of the source followers" may be replaced by another term "pitch of pixels" because they are equal to each other in general.

DESCRIPTION OF THE PREFERRED EMBODIMENTS

First, referring to FIG. 10A-10F, a description will be made with respect to a manufacturing process of thin-film transistors used in the present invention.

Figure 10A:
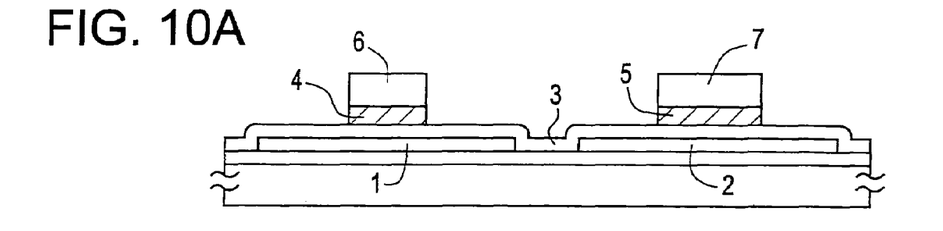
FIGS. 10A-10F shows a manufacturing process of a complementary inverter circuit.

A complementary inverter circuit will be described by way of embodiment. A silicon dioxide film of 1,000-3,000 Å in thickness was formed as an undercoat oxide film on a glass substrate (low-alkali glass, quartz glass, or the like; for instance Corning 7059) by sputtering in an oxygen atmosphere. To improve the productivity, there may be used a film obtained by decomposing and depositing TEOS by plasma CVD.

Then, an amorphous silicon film was deposited at a thickness of 300-5,000 Å, preferably 500-1,000 Å by plasma CVD or LPCVD, and crystallized by being left in a reducing atmosphere of 550° C. to 600° C. for 4-48 hours. The degree of crystallization was increased by performing laser light illumination (wavelength: 308 or 248 nm) after the above step. The silicon film thus crystallized was patterned into island-like regions 1 and 2. A silicon dioxide film 3 of 700-1,500 Å in thickness was formed thereon by sputtering.

Subsequently, a film of aluminum (containing Si of 1 wt % or Sc of 0.1-0.3 wt %) of 1,000 Å to 3 µm was formed by electron beam evaporation or sputtering. A photoresist (for instance, OFPR800/30 cp produced by Tokyo Ohka Kogyo Co., Ltd.) was then formed by spin coating. Formation of an aluminum oxide film of 100-1,000 Å in thickness by anodic oxidation before the formation of the photoresist was effective in providing good adhesiveness with the photoresist and in forming a porous anodic oxide film only on the side faces in a subsequent anodic oxidation step by suppressing a leak current from the photoresist. The photoresist and the aluminum film were patterned, i.e., etched together to form gate electrodes 4 and 5 and mask films 6 and 7 (see FIG. 10A).

Anodic oxidation was performed on the resulting structure by supplying it with a current in an electrolyte, to form anodic oxide films 8 and 9 of 3,000-6,000 Å, for instance, 5,000 Å in thickness. The anodic oxidation may be performed such that a 3% to 20% acid aqueous solution of citric acid, oxalic acid, phosphoric acid, chromic acid, sulfuric acid, or the like is used and a constant voltage of 10-30 V is applied to the gate electrodes. In this embodiment, the anodic oxidation was performed for 20-40 minutes in oxalic acid of 30° C. by applying a voltage of 10 V. The thickness of the anodic oxide films 8 and 9 was controlled by the anodic oxidation time (see FIG. 10B).

Figure 10B:
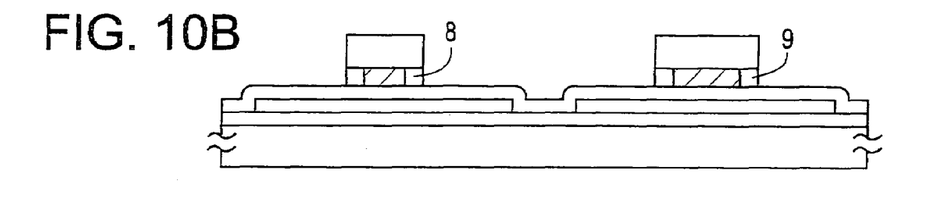

After removing the mask films 6 and 7, the gate electrodes 4 and 5 were again supplied with a current in an electrolyte. An ethylene glycol solution containing tartaric acid, boric acid and nitric acid (3% to 10% in total) was used this time. A superior oxide film was obtained when the temperature of the solution was about 10° C., i.e., lower than the room temperature. As a result, barrier type anodic oxide films 10 and 11 were formed on the top and side faces of the gate electrodes 4 and 5. The thickness of the anodic oxide films 10 and 11 was proportional to the application voltage. For instance, a 2,000-Å-thick anodic oxide film was formed with an application voltage of 150 V. The thickness of the anodic oxide films 10 and 11 was determined by a necessary offset. It is preferred that the thickness be less than 3,000 Å, because a high voltage of more than 250 V is needed to produce an anodic oxide film thicker than 3,000 Å and will cause adverse effects on characteristics of the thin-film transistors. In this embodiment, the voltage was increased to 80-150 V, and a proper voltage was selected depending on a necessary thickness of the anodic oxide films 10 and 11.

It should be noted that the barrier-type anodic oxide films 10 and 11 were formed between the porous anodic oxide films 8 and 9 and the gate electrodes 4 and 5 rather than outside the porous anodic oxide films 8 and 9, though the step of forming the barrier-type anodic oxide films 10 and 11 was performed later.

Then, the insulating film 3 was etched by dry etching (or wet etching). The etching depth may be determined arbitrarily; that is, the etching may be performed until the underlying active layers 1 and 2 are exposed, or may stopped halfway. In terms of the productivity, yield and uniformness, it is desirable that the etching be performed until reaching the active layers 1 and 2. In this case, insulating films 12 and 13 having the original thickness are left in the portions of the insulating film (gate insulating film 3) covered with the anodic oxide films 8 and 9 or the gate electrodes 4 and 5 (see FIG. 10C).

Figure 10C:
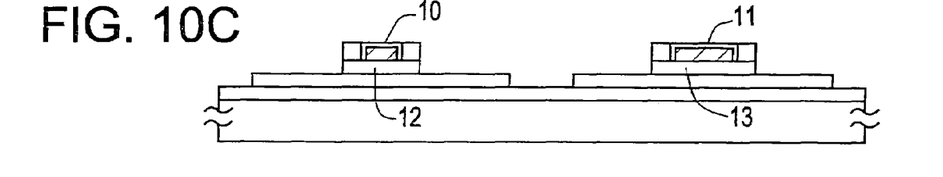
Figure 10D:
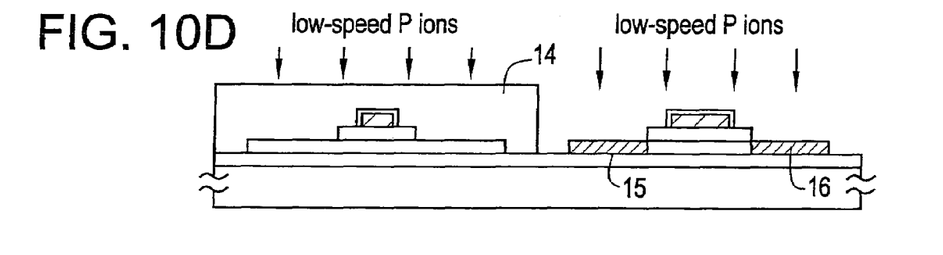

Then, the anodic oxide films 8 and 9 were removed. It is preferred that the etchant be a phosphoric acid type solution, for instance, a mixed acid of phosphoric acid, acetic acid and nitric acid.

With a phosphoric acid type etchant, the porous anodic oxide films 8 and 9 are etched at a rate that is more than 10 times faster than the barrier-type anodic oxide films 10 and 11. Therefore, substantially the barrier-type anodic oxide films 10 and 11 are not etched with a phosphoric acid type etchant. Thus, the gate electrodes inside the barrier-type anodic oxide films were protected.

Sources and drains were formed by implanting accelerated N-type or P-type impurity ions into the active layers 1 and 2 of the above structure. More specifically, first, with the left-hand thin-film transistor region covered with a mask 14, phosphorus ions of relatively low speed (typical acceleration voltage: 5-30 kV) were introduced by ion doping. In this embodiment, the acceleration voltage was set at 20 kV. Phosphine ($PH_3$) was used as a doping gas. The dose was $5 \times 10^{14}$ to $5 \times 10^{15}$ cm$^{-2}$. In this step, phosphorus ions cannot penetrate the insulating film 13, they were implanted into only the portions of the active region 2 whose surfaces were exposed, to form a drain 15 and a source 16 of the N-channel thin-film transistor (see FIG. 10D).

Subsequently, phosphorus ions of relatively high speed (typical acceleration voltage: 60-120 kV) were introduced also by ion doping. In this embodiment, the acceleration voltage was 90 kV, and the dose was $1 \times 10^{13}$ to $5 \times 10^{14}$ cm$^{-2}$. In this step, phosphorus ions penetrate the insulating film 13 to reach the underlying portions. However, due to the small dose, low-concentration N-channel regions 17 and 18 were formed (see FIG. 10E).

Figure 10E:
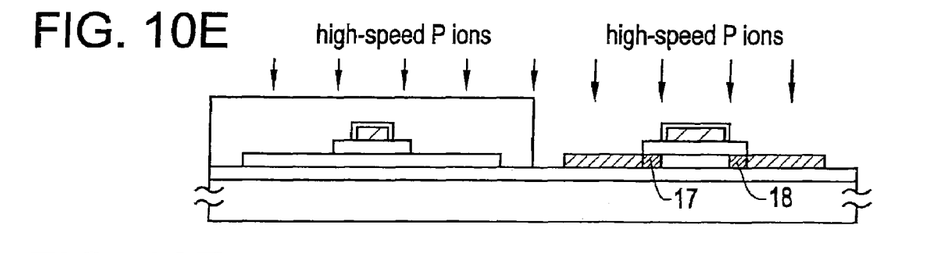
Figure 10F:
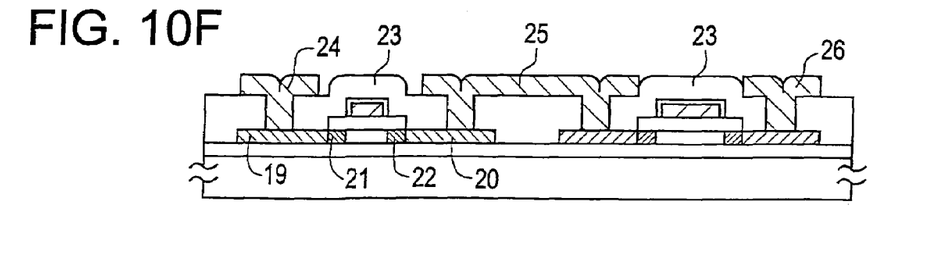

After completion of the phosphorus doping, the mask 14 was removed. In a manner similar to the above, a source 19, a drain 20, and low-concentration P-type regions 21 and 22 were formed in the P-channel thin-film transistor region with the N-channel thin-film-transistor region masked this time. Impurity ions introduced into the active regions 1 and 2 were activated by illumination with KrF excimer laser light (wavelength: 248 nm; pulse width: 20 nsec).

Finally, a silicon dioxide film of 3,000-6,000 Å in thickness was formed over the entire surface as an interlayer insulating film 23 by CVD. After contact holes for the sources and drains of the thin-film transistors were formed, aluminum wiring lines and electrodes 24-26 were formed. Further, hydrogen annealing was performed at 200° C. to 400° C. Thus, a complementary inverter circuit using the thin-film transistors was completed (see FIG. 10F).

Although the above description is directed to the inverter circuit, other circuits can be manufactured in similar manners. Further, although the above description is directed to the coplanar thin-film transistors, it can be applied to other types of thin-film transistors such as inverse-stagger type ones.

Embodiments of the invention will be described below.

Figure 1:
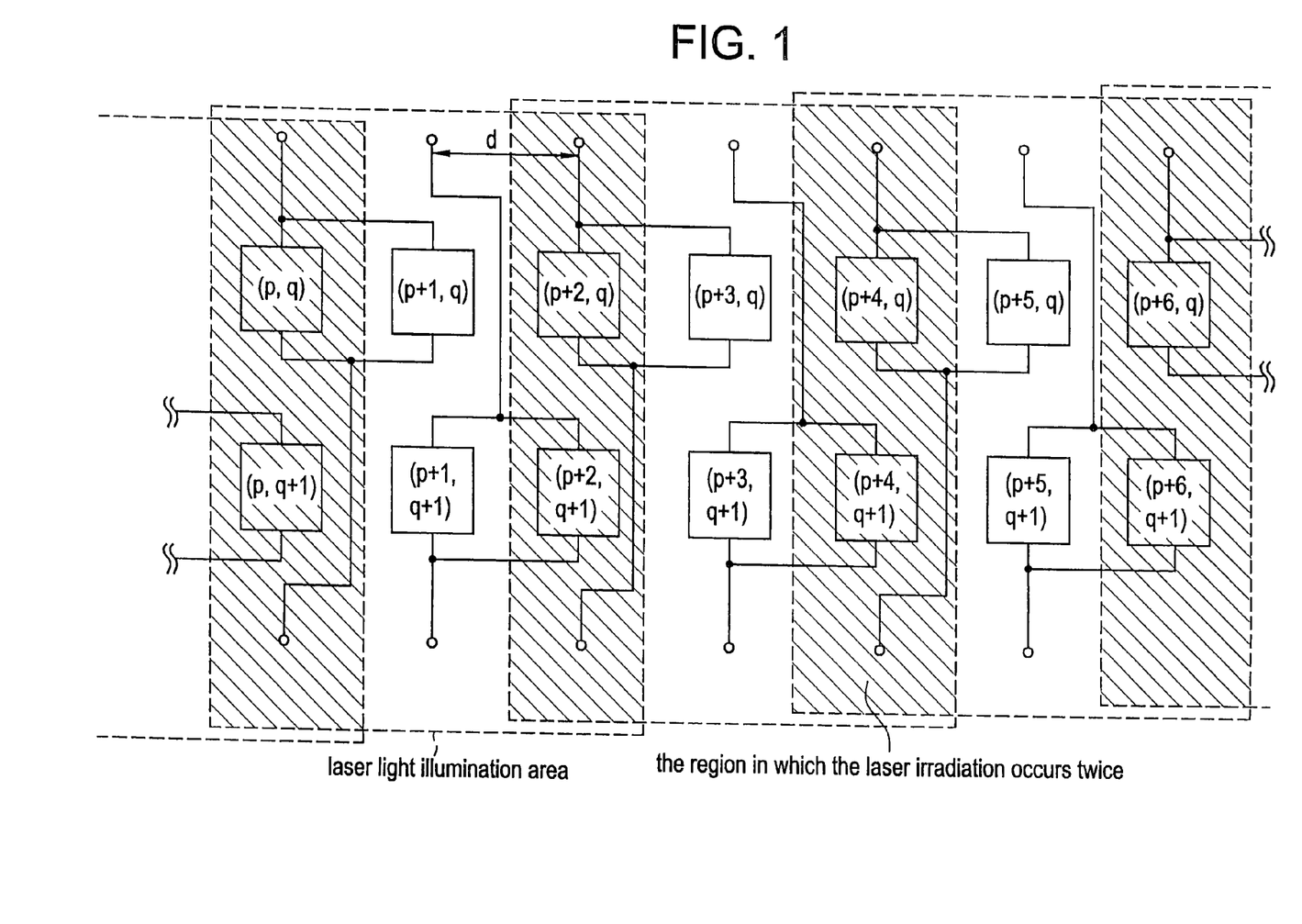
FIG. 1 is a circuit diagram showing analog buffers of an active matrix type display device according to a first embodiment of the present invention.

FIG. 1 shows a first embodiment of the invention. In this embodiment, source followers are arranged at a pitch d, and the laser light illumination width L is equal to 3d. Two source followers are connected to each other in parallel. Representing, a source follower matrix by (l, m), the laser light is first applied to source followers (p, q), (p+1, q), (p+2, q),(p, q+1), (p+1, q+1), and (p+2, q+1).

The laser light is then moved so as to illuminate source followers (p+2, q), (p+3, q), (p+4, q), (p+2, q+1), (p+3, q+1), and (p+4, q+1). Actually, after the first laser irradiation, the substrate mounted on a X-Y table is moved and then the second irradiation is carried out.

Further, a next laser irradiation is carried out onto the source followers (p+4, q), (P+5, q), (p+6, q), (p+4, q+1), (P+5, q+1), and (p+6, q+1).

In the above manner, the source followers (p, q), (p, q+1), (p+2, q), (p+2, q+1). (p+4, q), (p+4, q+1), (p+6, q) and (p+6, q+1) are illuminated twice with the laser light. Thus, they have the threshold voltage $V_{thL}$ in view of FIG. 8.

On the other hand, the source followers (p+1, q), (p+1, q+1), (p+3, q), (p+3, q+1), (p+5, q), and (p+5, q+1) are illuminated only once with the laser light. Thus, they have the threshold voltage $V_{thH}$.

By connecting to each other in parallel the source followers (p, q) and (p+1, q), the source followers (p+2, q) and (p+3, q), the source followers (p+4, q) and (p+5, q), the source followers (p+1, q+1) and (p+2, q+1), and the source followers (p+3, q+1) and (p+4, q+1) as shown in FIG. 1, the characteristics of the source followers are averaged, so that variations in the characteristics caused by the laser illumination can be reduced. In other words, in each combined source followers, one source follower has a higher crystallinity TFT while the other one has a lower crystallinity TFT.

Figure 2:
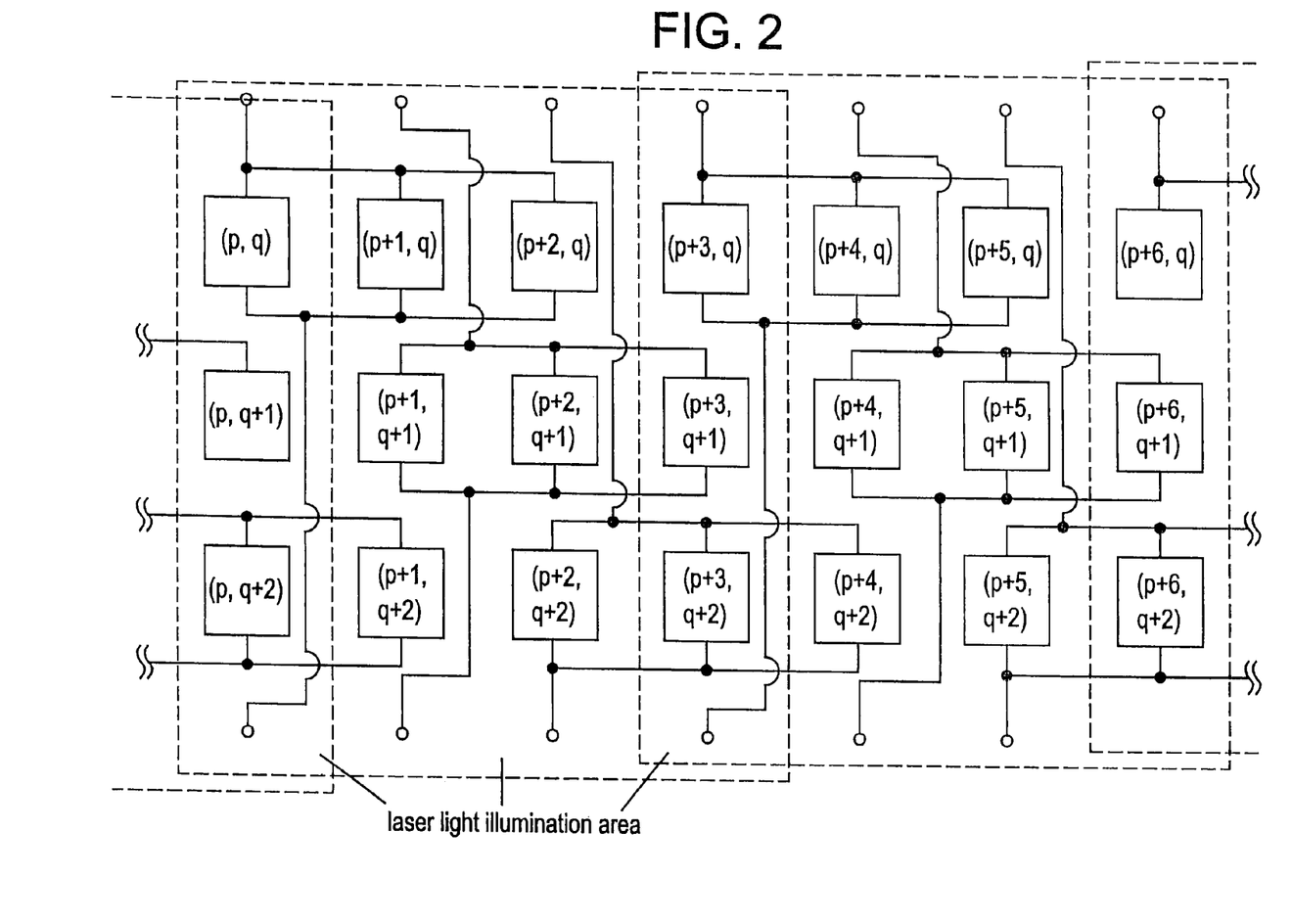
FIG. 2 is a circuit diagram showing analog buffers of an active matrix type display device according to a second embodiment of the invention.

FIG. 2 shows a second embodiment of the invention. In this embodiment, source followers are arranged at a pitch d, and the laser light illumination width L is equal to 4d. Three source followers are connected together in parallel.

The laser light is first applied to source followers (p, q), (p+1, q), (p+2, q), (p+3, q), (p, q+1), (p+1, q+1), (p+2, q+1), (p+3, q+1), (p, q+2), (p+1, q+2), (p+2, q+2) and (p+3, q+2).

The laser light is then moved so as to illuminate source followers (p+3, q), (p+4, q), (p+5, q), (p+6, q), (p+3, q+1), (p+4, q+1), (p+5, q+1), (p+6, q+1), (p+3, q+2), (p+4, q+2), (p+5, q+2) and (p+6, q+2).

Since the source followers (p, q), (p, q+1), (p, q+2), (p+3, q), (p+3, q+1), (p+3, q+2), (p+6, q), (p+6, q+1) and (p+6, q+2) are illuminated twice with the laser light, they have the threshold voltage $V_{thL}$ (see FIG. 8).

Since the source followers (p+1, q), (p+2, q), (p+1, q+1), (p+2, q+1), (p+1, q+2), (p+2, q+2), (p+4, q), (p+5, q), (p+4, q+1), (p+5, q+1), (p+4, q+2) and (p+5, q+2) are illuminated only once with the laser light, they have the threshold voltage $V_{thH}$ (see FIG. 8).

By connecting together in parallel the source followers (p, q), (p+1, q) and (p+2, q), the source followers (p+3, q), (p+4, q) and (p+5, q), the source followers (p+1, q+1), (p+2, q+1) and (p+3, q+1), the source followers (p+4, q+1), (p+5, q+1) and (p+6, q+1), and the source followers (p+2, q+2), (p+3, q+2) and (p+4, q+2), respectively, as shown in FIG. 2, one of the three source followers of each combination is illuminated twice with the laser light and the other two source followers are illuminated only once. By combining the source followers in the above manner, the source followers of every set are made uniform, so that variations in the characteristics caused by the laser illumination can be eliminated.

Figure 3:
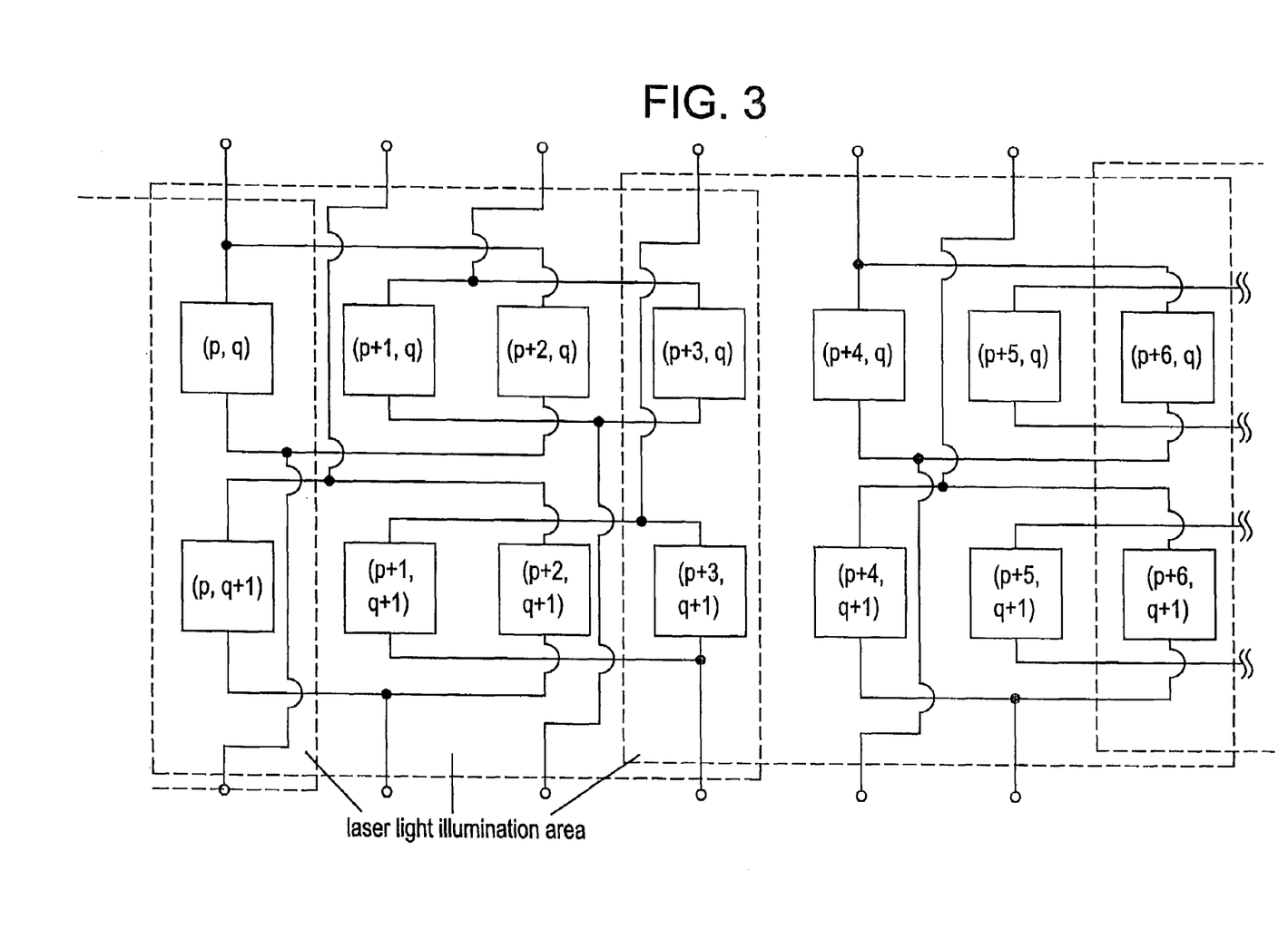
FIG. 3 is a circuit diagram showing analog buffers of an active matrix type display device according to a third embodiment of the invention.

FIG. 3 shows a third embodiment of the invention. In this embodiment, source followers are arranged at a pitch d, and the laser light illumination width L is equal to 4d. Two source followers are connected in parallel to form one analog buffer where one source follower of an adjacent buffer is located between the two.

The laser light is first applied to source followers (p, q), (p+1, q), (p+2, q), (p+3, q), (p, q+1), (p+1, q+1), (p+2, q+1) and (p+3, q+1).

The laser light is then moved so as to illuminate source followers (p+3, q), (p+4, q), (p+5, q), (p+6, q), (p+3, q+1), (p+4, q+1), (p+5, q+1) and (p+6, q+1).

Since the source followers (p, q), (p, q+1), (p+3, q), (p+3, q+1), (p+6, q) and (p+6, q+1) are illuminated twice with the laser light, they have the threshold voltage $V_{thL}$ (see FIG. 8).

Since the source followers (p+1, q), (p+2, q), (p+1, q+1), (p+2, q+1), (p+4, q), (p+5, q), (p+4, q+1) and (p+5, q+1) are illuminated only once with the laser light, they have the threshold voltage $V_{thH}$ (see FIG. 8).

By connecting to each other in parallel the source followers (p, q) and (p+2, q), the source followers (p+1, q) and (p+3, q), the source followers (p+4, q) and (p+6, q), the source followers (p, q+1) and (p+2, q+1), the source followers (p+!, q+1) and (p+3, q+1), and the source followers (p+4, q+1) and (p+6, q+1) as shown in FIG. 3, one of the two source followers of each combination is illuminated twice with the laser light and the other source follower is illuminated only once. By combining the source followers in the above manner, the source followers of every set are made uniform, so that variations in the characteristics caused by the laser illumination can be eliminated.

Figure 4:
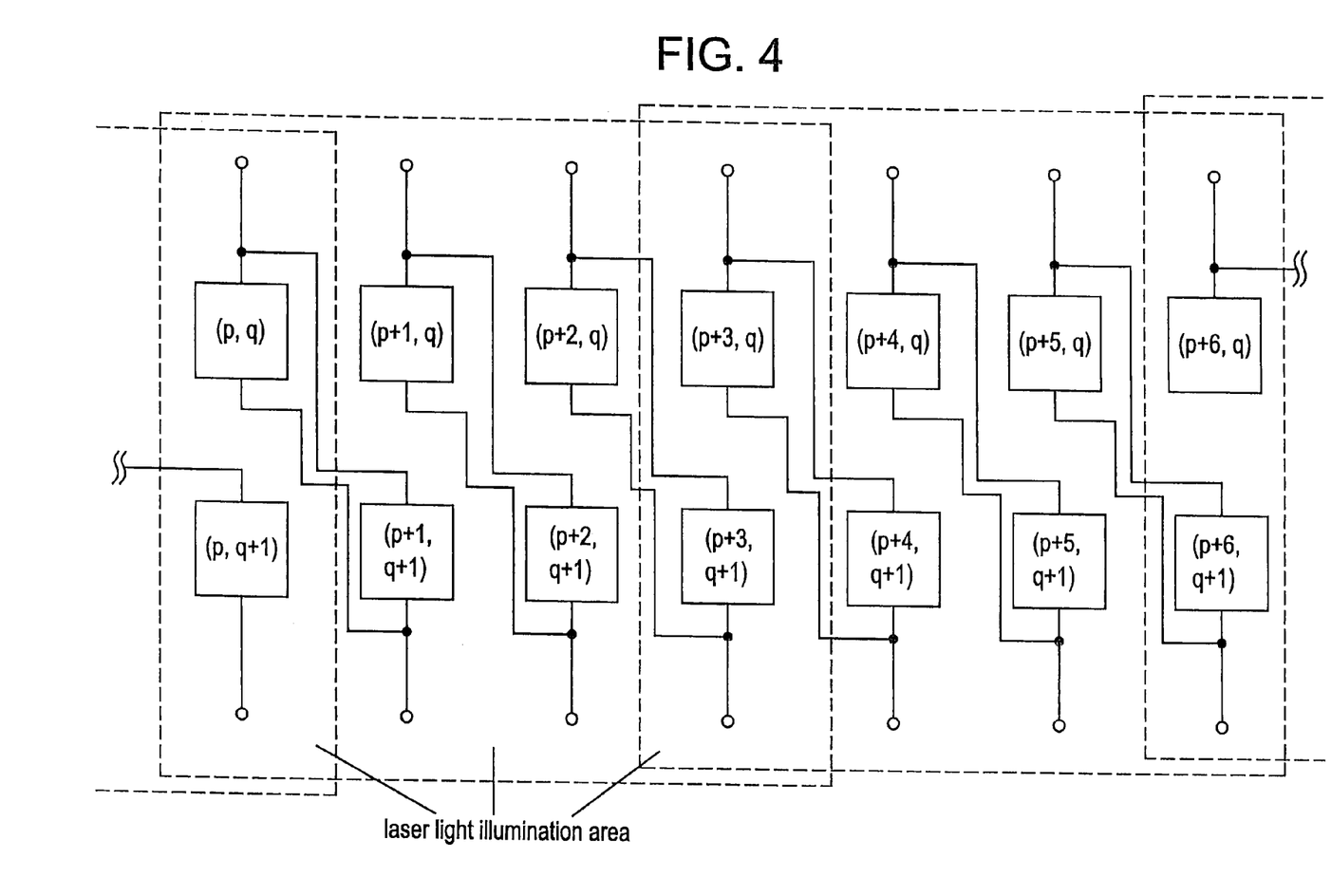
FIG. 4 is a circuit diagram showing analog buffers of an active matrix type display device according to a fourth embodiment of the invention.

FIG. 4 shows a fourth embodiment of the invention. In this embodiment, source followers are arranged at a pitch d, and the laser light illumination width L is equal to 4d. Two source followers that are located in an oblique direction are connected to each other in parallel.

The laser light is first applied to source followers (p, q), (p+1, q), (p+2, q), (p+3, q), (p, q+1), (p+1, q+1), (p+2, q+1) and (p+3, q+1).

The laser light is then moved so as to illuminate source followers (p+3, q), (p+4, q), (p+5, q), (p+6, q), (p+3, q+1), (p+4, q+1), (p+5, q+1) and (p+6, q+1).

By connecting to each other in parallel the source followers (p, q) and (p+1, q+1), the source followers (p+1, q) and (p+2, q+1), the source followers (p+2, q) and (p+3, q+1), the source followers (p+3, q) and (p+4, q+1), the source followers (p+4, q) and (p+5, q+1), and the source followers (p+5, q) and (p+6, q+1) as shown in FIG. 4, the characteristics of the source followers are averaged, so that variations in the characteristics caused by the laser illumination can be reduced.

Figure 5:
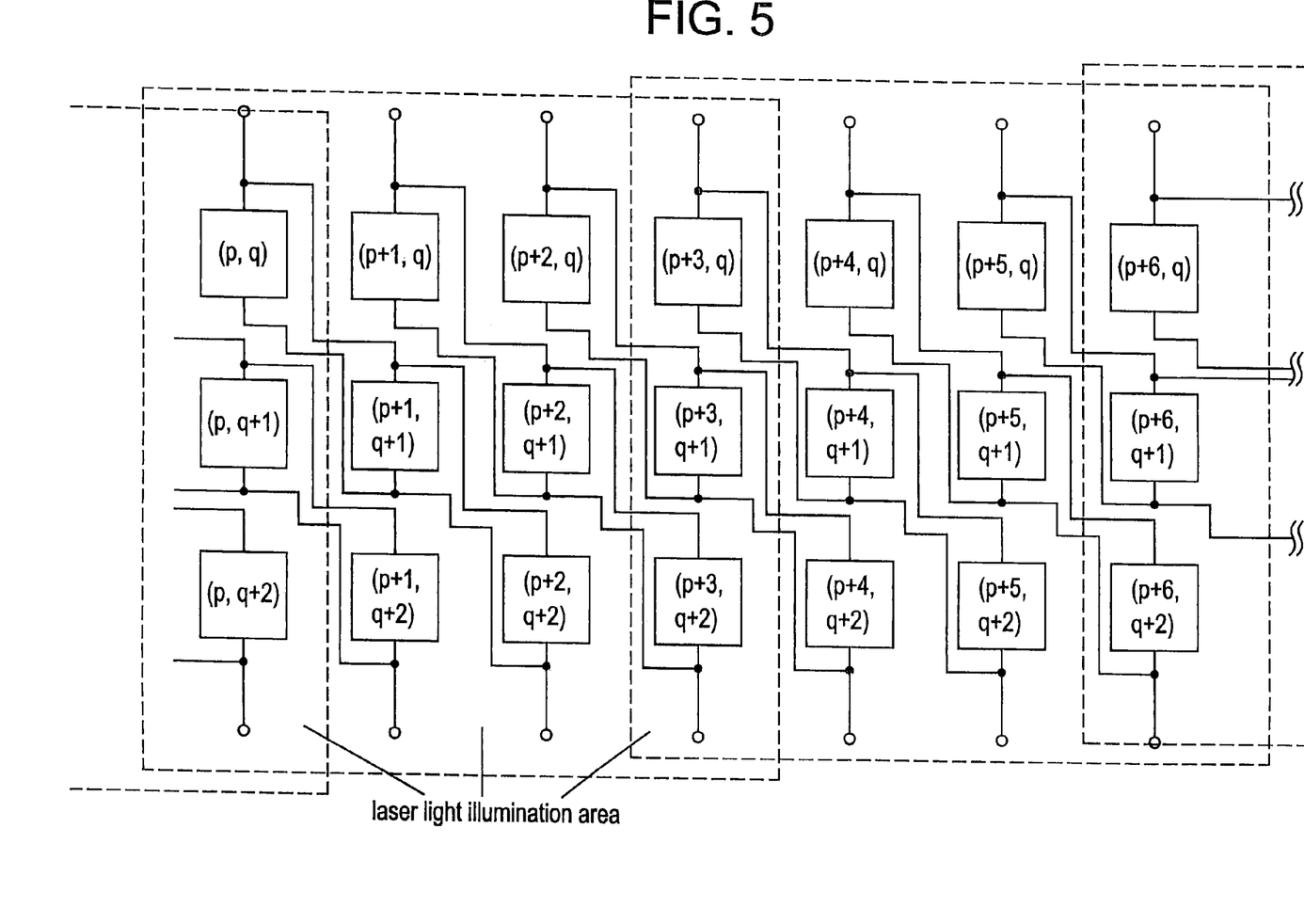
FIG. 5 is a circuit diagram showing analog buffers of an active matrix type display device according to a fifth embodiment of the invention.

FIG. 5 shows a fifth embodiment of the invention. In this embodiment, source followers are arranged at a pitch d, and the laser light illumination width L is equal to 4d. Three source followers located in an oblique direction are connected together in parallel.

The laser light is first applied to source followers (p, q), (p+1, q), (p+2, q), (p+3, q), (p, q+1), (p+1, q+1), (p+2, q+1), (p+3, q+1), (p, q+2), (p+1, q+2), (p+2, q+2) and (p+3, q+2).

The laser light is then moved so as to illuminate source followers (p+3, q), (p+4, q), (p+5, q), (p+6, q), (p+3, q+1), (p+4, q+1), (p+5, q+1), (p+6, q+1), (p+3, q+2), (p+4, q+2), (p+5, q+2) and (p+6, q+2).

Since the source followers (p, q), (p, q+1), (p, q+2), (p+3, q), (p+3, q+1), (p+3, q+2), (p+6, q), (p+6, q+1) and (p+6, q+2) are illuminated twice with the laser light, they have the threshold voltage $V_{thL}$ (see FIG. 8).

Since the source followers (p+1, q), (p+2, q), (p+1, q+1), (p+2, q+1), (p+1, q+2), (p+2, q+2), (p+4, q), (p+5, q), (p+4, q+1), (p+5, q+1), (p+4, q+2) and (p+5, q+2) are illuminated only once with the laser light, they have the threshold voltage $V_{thH}$ (see FIG. 8).

By connecting together in parallel the source followers (p, q), (p+1, q+1) and (p+2, q+2), the source followers (p+1, q), (p+2, q+1) and (p+3, q+2), the source followers (p+2, q), (p+3, q+1) and (p+4, q+2), the source followers (p+3, q), (p+4, q+1) and (p+5, q+2), and the source followers (p+4, q), (p+5, q+1) and (p+6, q+2) as shown in FIG. 5, one of the three source followers of each combination is illuminated twice with the laser light and the other two source followers are illuminated only once. By combining the source followers in the above manner, the source followers of every set are made uniform, so that variations in the characteristics caused by the laser illumination can be eliminated.

As described above, by connecting in parallel the source followers that use thin-film transistors, the invention can suppress a variation of the threshold voltage $V_{th}$ due to overlapping of laser light illumination areas, to thereby reduce display unevenness of pixels.

While preferred embodiments of the present invention has been described, it is to be understood that the present invention should not be limited to those specific embodiments. Various modifications may be made by those ordinary skilled in the art. For example, it is possible to replace the source followers with other elements having an equivalent function, for example, op amp.

What is claimed is:

1. A method of manufacturing a device including buffer circuits, said method comprising the steps of:
   forming a semiconductor film over a substrate;
   irradiating said semiconductor film with a light beam to crystallize said semiconductor film; and
   forming said buffer circuits by using the crystallized semiconductor film as an active layer,
   wherein each of said buffer circuits comprises at least first and second circuits connected with each other,
   wherein said buffer circuits are arranged in a first direction over said substrate and said light beam has a line-shaped cross section at said semiconductor film extending in a second direction orthogonal to said first direction.

2. A method according to claim 1 wherein said light beam is a pulsed laser beam.

3. A method according to claim 1 wherein said first and second circuits are source follower circuits.

4. A method according to claim 1 wherein said device is an active matrix device.

5. A method according to claim 1 wherein said first circuit in one of the buffer circuits is formed by said forming said buffer circuits step to have different electrical characteristics from said second circuit of said one of the buffer circuits.

6. A method of manufacturing a device including at least first and second buffer circuits, said method comprising the steps of:
   forming a semiconductor film over a substrate;
   irradiating said semiconductor film with a laser beam to crystallize said semiconductor film wherein said laser beam has a cross section at said semiconductor film where said cross section has a line-shape extending in a first direction; and forming said first and second buffer circuits by using the crystallized semiconductor film as an active layer, wherein said buffer circuits are arranged in a direction orthogonal to said first direction, wherein each of said buffer circuits includes at least first and second circuits, one of said first and second circuits of said first buffer circuit is positioned in a same line along said first direction as one of said first and second circuits of said second buffer circuit.

7. A method according to claim 6 wherein said laser beam is a pulsed laser light.

8. A method according to claim 6 wherein said first and second circuits of the first and second buffer circuits are source follower circuits.

9. A method according to claim 6 wherein said device is a display device.

10. A method of manufacturing a device including at least first and second buffer circuits, said method comprising the steps of:

forming a semiconductor film over a substrate;

irradiating said semiconductor film with a laser beam to crystallize said semiconductor film wherein a cross section of said laser beam at said semiconductor film has a line-shape extending in a first direction and said laser beam is scanned in a second direction orthogonal to said first direction;

patterning the irradiated semiconductor film into a plurality of island-like semiconductor regions for a plurality of thin film transistors;

forming a plurality of gate electrodes adjacent to said plurality of semiconductor regions;

forming said first and second buffer circuits wherein each of said first and second buffer circuits comprises at least first and second circuits, each of which includes at least one of said plurality of thin film transistors, wherein said first and second buffer circuits are arranged in said second direction, wherein the first and second circuits in each of said buffer circuits are connected in parallel, and one of the first and second circuits of the first buffer circuit is located in a same line along said first direction as one of the first and second circuits of the second buffer circuit.

11. A method according to claim 10 wherein one of said plurality of gate electrodes is positioned over one of said plurality of semiconductor regions.

12. A method according to claim 10 wherein one of said plurality of gate electrodes is positioned below one of said plurality of semiconductor regions.

13. A method according to claim 10 wherein said device is a display device.

14. A method according to claim 10 wherein said laser beam is a pulsed laser beam.

* * * * *